United States Patent [19]

Kobayashi et al.

[11] Patent Number: 4,563,600

[45] Date of Patent: Jan. 7, 1986

[54] ECL CIRCUIT HAVING A NEGATIVE FEEDBACK DIFFERENTIAL TRANSISTOR CIRCUIT TO INCREASE THE OPERATING SPEED OF THE OUTPUT CIRCUIT

[75] Inventors: Tohru Kobayashi, Tachikawa; Kazuo Nakamura, Koganei, both of Japan

[73] Assignee: Hitachi, Ltd., Tokyo, Japan

[21] Appl. No.: 441,180

[22] Filed: Nov. 12, 1982

[30] Foreign Application Priority Data

Nov. 13, 1981 [JP] Japan ................... 56-181141

[51] Int. Cl.$^4$ ............. H03K 19/086; H03K 19/092; H03K 19/013
[52] U.S. Cl. ............................ 307/455; 307/475
[58] Field of Search ............ 307/454, 455, 466, 467, 307/475, 443, 445, 310, 297, 359, 362, 264, 270, 363, 358

[56] References Cited

U.S. PATENT DOCUMENTS

| | | | |
|---|---|---|---|
| 3,404,285 | 10/1968 | Hazlett | 307/455 |
| 3,501,647 | 3/1970 | Giacomo | 307/455 |
| 3,648,064 | 3/1972 | Mukai et al. | 307/455 |
| 4,329,597 | 5/1982 | Yamagiwa | 307/310 X |
| 4,453,095 | 6/1984 | Wrathall | 307/475 |

FOREIGN PATENT DOCUMENTS 0062485 10/1982 European Pat. Off. ............ 307/455

OTHER PUBLICATIONS

Yoshitaka Itou, et al, "ECL LSI Circuit Design", Review of the Electrical Communication Laboratories; vol. 26, Nos. 9-10, pp. 1339-1354, Sep.-Oct. 1978.

*Primary Examiner*—Stanley D. Miller
*Assistant Examiner*—David R. Bertelson
*Attorney, Agent, or Firm*—Antonelli, Terry & Wands

[57] ABSTRACT

An ECL semiconductor integrated circuit is constructed of an input circuit, a minor amplitude ECL circuit and an output circuit. The input circuit has its operating speed improved by using a negative feedback type differential transistor circuit. Thanks to the improvement in the operating speed of the input circuit, the overall response time of the ECL semiconductor integrated circuit can be significantly shortened. The output circuit is arranged to operate in conjunction with a minor amplitude signal received from the ECL circuit, and can include provisions both for generating minor level signals for the ECL and an output circuit at a normal ECL level for coupling to external circuit operating at such a normal level. Also, in one embodiment, the output circuit can operate with a negative feedback type differential transistor circuit to increase the operating speed of the output circuit.

18 Claims, 13 Drawing Figures

ECL CIRCUIT HAVING A NEGATIVE FEEDBACK DIFFERENTIAL TRANSISTOR CIRCUIT TO INCREASE THE OPERATING SPEED OF THE OUTPUT CIRCUIT

BACKGROUND OF THE INVENTION

The present invention relates to a semiconductor integrated circuit device including an ECL (Emitter Coupled Logic).

In semiconductor integrated circuit devices such as ECL (or CML: Current Mode Logic), it is well known in the art, as shown by Japanese Patent Laid-Open No. 134780/1975, that the logic amplitude of an inside ECL circuit is made smaller than that of an outside one in order to speed up the internal operation and reduce the power consumption of the semiconductor integrated circuit device. This type of inside ECL semiconductor integrated circuit device includes an output circuit which is constructed of a logic circuit which exists in the prior art and which is made operative with a normal logic amplitude. As a result, the output circuit allows its output signal to have its operating margin enlarged when the output signal is fed out to external wirings outside of the integrated circuit which have a high noise induction or the like. On the contrary, an inside ECL circuit constructed inside of the integrated circuit is constructed of a minor amplitude ECL circuit so as to ensure the aforementioned speed-up and reduction in the power consumption because it is hardly influenced by the above-described noises or the like.

In the semiconductor integrated circuit thus far described, the inside ECL circuit is made to have its low signal level set at a relatively high level. Accordingly, the integrated circuit device is equipped with an input circuit for receiving an external input signal having a normal level and for shifting the low level of this signal toward the high level.

The input circuit is made to have a construction similar to that of a typical ECL circuit. Therefore, it will have a threshold voltage when it is supplied with a suitable reference voltage which is proper for the external input signal. Moreover, the input circuit solves the following problems which are caused when the external input signal is fed directly to the inside ECL circuit.

Specifically, the inside ECL circuit has its logic threshold voltage set at a relatively high level. Accordingly, the difference between the high level of the external input signal and the logic threshold voltage of the inside ECL circuit is made relatively small. On the other hand, the difference between the low level of the external input signal and the logic threshold voltage is made large. As a result, both the response time of the inside ECL circuit when the external input signal is changed from the high level to the low level and the response time of the inside ECL circuit when the external input signal is changed from the low level to the high level are varied. Moreover, since the difference between the high level of the external input signal and the threshold voltage of the inside ECL circuit is so small, the noise margin of the circuit device is reduced. This problem concerning the noise margin is considered serious because, generally, a relatively large amount of noise is imparted to the outside wirings for feeding the external input signal therethrough.

The input circuit can solve the above problem by having its threshold voltage set at a proper level. However, this input circuit itself establishes a relatively large signal delay. Therefore, it becomes difficult to shorten the overall response time of the integrated circuit device.

In order to solve this new problem which is brought about by the provision of the input circuit typically used for inside ECL circuits, the inventors have examined an inside ECL circuit which has such a relatively low logic threshold voltage that the external input signal may be fed directly to the minor amplitude inside ECL circuit without using such an input circuit. In this case, however, the number of circuit elements in each minor amplitude inside ECL circuit is increased, as will be explained in the following discussion. This results in the integration of the integrated circuit being deteriorated. Especially in a large scale integration device having several thousands gates of the ECLs in one chip, the deterioration in the integration leads to a remarkable increase in the occupied area on the chip, thereby causing a serious disadvantage.

FIG. 1 is a block diagram showing, by two-dotted chain lines, such as ECL integrated circuit (i.e., ECL LSI) which is constructed without incorporating an input circuit. In addition to minor amplitude ECL circuits $ECL_1$ to $ECL_n$, there are provided output circuits $OB_1$ to $OB_l$ for enlarging the logic amplitudes of the inside ECL circuits to a normal logic amplitude. The minor amplitude inside ECL circuits can be formed by a circuit such as shown in FIG. 2A. In this circuit, the ratios $R_{CN}/R_E$ and $R_{CO}/R_E$ of a pair of load resistances, which are connected to the respective collectors of paired differential transistors $Q_3$ and $Q_4$ constructing the ECL circuit to a constant-current resistance $R_E$ connected to the common emitter of the paired differential transistors, are set at a lower level than is done in the case of a normal ECL circuit.

By those settings of the resistance ratios, the constant current which flows through the aforementioned collector resistance $R_{CN}$ or $R_{CO}$ is set at a relatively low level. As a result, the voltage drop at the load resistance $R_{CN}$ or $R_{CO}$ by this constant current is relatively reduced so that an output signal $V_{out}$ has its low level shifted toward the high level. As a result, the output signal $V_{out}$ or $\overline{V_{out}}$ can have its amplitude made smaller than that of an input signal $V_{in}$.

Moreover, the circuit under consideration is especially provided with a level shifting resistance $R_l$. This level shifting resistance $R_l$ is required, as will be described hereinafter, for making the center level of the minor amplitude output signal $V_{out}$ substantially equal to that of the normal amplitude input signal $V_{in}$.

FIG. 2B is a diagram illustrating the input/output transmitting characteristics of the ECL circuit of FIG. 2A.

In this figure, the input/output transmission characteristic curve $V_{co}$ indicates the relationship for FIG. 2A between the normal amplitude input signal $V_{in}$ and the collector voltage $V_{co}$ of the transistor $Q_4$. The input/output transmission characteristic curve $V_{co}'$ illustrates that when the level shifting resistance $R_l$ is not employed, the collector voltage $V_{co}$ of the aforementioned transistor $Q_4$ is shifted toward the high level side until it takes the value $V_{co}'$. The input/output transmission characteristic curve $V_{out}$ indicates the relationship for FIG. 2A between the normal amplitude input signal $V_{in}$ and the minor amplitude output signal $V_{out}$. Finally, the input/output transmission characteristic curve $V_{out}'$ illustrates that when the level shifting resistance $R_l$ is not employed, the minor amplitude output signal $V_{out}$ is shifted toward the high level side until it takes the value $V_{out}'$.

From these curves it can be seen that by providing the level shifting resistance $R_l$ the output signal of the ECL circuit can be shifted toward the low level side by the voltage drop (e.g., 0.1 V) at that resistance $R_l$. For example, the minor amplitude output signal $V_{out}$ has its high output level shifted from $V_{out}(H)'$ ($-0.9$ V) to $V_{out}(H)$ ($-1.0$ V) and its low output level from $V_{out}(L)'$ ($-1.5$ V) to $V_{out}(L)$ ($-1.6$ V).

As a result, the center level $V_{tho}$ of the output signal $V_{out}$ can be deduced from the following Equation (1):

$$V_{tho} = (V_{out}(H) + V_{out}(L))/2 \quad (1)$$
$$= \{(-1.0) + (-1.6)\}/2$$
$$= -1.3 \text{ (V)}.$$

Thus, the minor amplitude output signal $V_{out}$ can have its center level $V_{tho}$ ($-1.3$) made substantially equal to the center level $V_{thi}$ (i.e., a logic threshold voltage: e.g., $-1.32$ V) of the normal amplitude input signal $V_{in}$.

In this case, however, a problem arises in that the integration of the integrated circuit is lowered because each minor amplitude inside ECL circuit requires a level shifting resistance $R_l$, as has been described in the above. Also, another disadvantage is created because useless power is consumed by the aforementioned level shifting resistance $R_l$. This, of course, undesirably increases the overall power consumption of the circuit.

Thus, it can be seen that in an ECL integrated circuit device (ECL LSI) having a lower internal logic amplitude than an external logic amplitude, as has been described hereinbefore, it is preferable to have a special input circuit for receiving the input signal of the former separate from the minor amplitude inside ECL circuit to avoid the above disadvantages. However, the experiments of the inventors have revealed that the transmission delay time of that input circuit is innegligibly high in comparison with the time required for the logic operations in the ECL LSI, and that, because of this, the overall operating speed of this ECL LSI is considerably restricted.

For example, when the input circuit is constructed of the normal ECL circuit, as has been described in the foregoing Japanese Patent Laid-Open No. 34780/1975, its transmission delay time is about 0.3 nanosecs.

On the other hand, the transmission delay time of the minor amplitude inside ECL circuit for one gate is about 0.35 to 0.8 nanosecs. About four gates are connected in cascade to perform one logic operation. Therefore, the time necessary for the logic operation inside of the LSI is about 1.4 (i.e., $0.35 \times 4 = 1.4$) nanosecs at the minimum.

In the worst case, therefore, the time (e.g., 0.3 nanosecs) required by the input circuit reaches a value as high as 21 ($0.3/1.4 \approx 0.21$) % of the time (e.g., 1.4 nanosecs) necessary for the actual logic operation.

Therefore, the reduction in the transmission delay time of that input circuit is very important for the improvement in the operating speed of the ECL LSI as a whole.

SUMMARY OF THE INVENTION

It is, therefore, an object of the present invention to provide an ECL semiconductor integrated circuit device having an improved operating speed.

Another object of the present invention is to provide a high speed input circuit for an inside ECL circuit.

To achieve these and other objects, an ECL semiconductor integrated circuit device according to the present invention has an input circuit which includes a first transistor having its base fed with an input signal, a second transistor coupled to said first transistor for current switching operations therewith, a load element connected with the collector of said second transistor, and a bias circuit for generating a bias voltage, which is to be fed to the base of said second transistor, in response to the collector output of said second transistor. In accordance with this construction, the capacitance between the collector and base of the aforementioned second transistor can be substantially neglected. As a result, the operating speed (i.e., the transmission delay time) is improved.

DESCRIPTION OF THE PREFERRED EMBODIMENTS

The present invention will be described in detail in the following in connection with the embodiments thereof.

Figure 3:
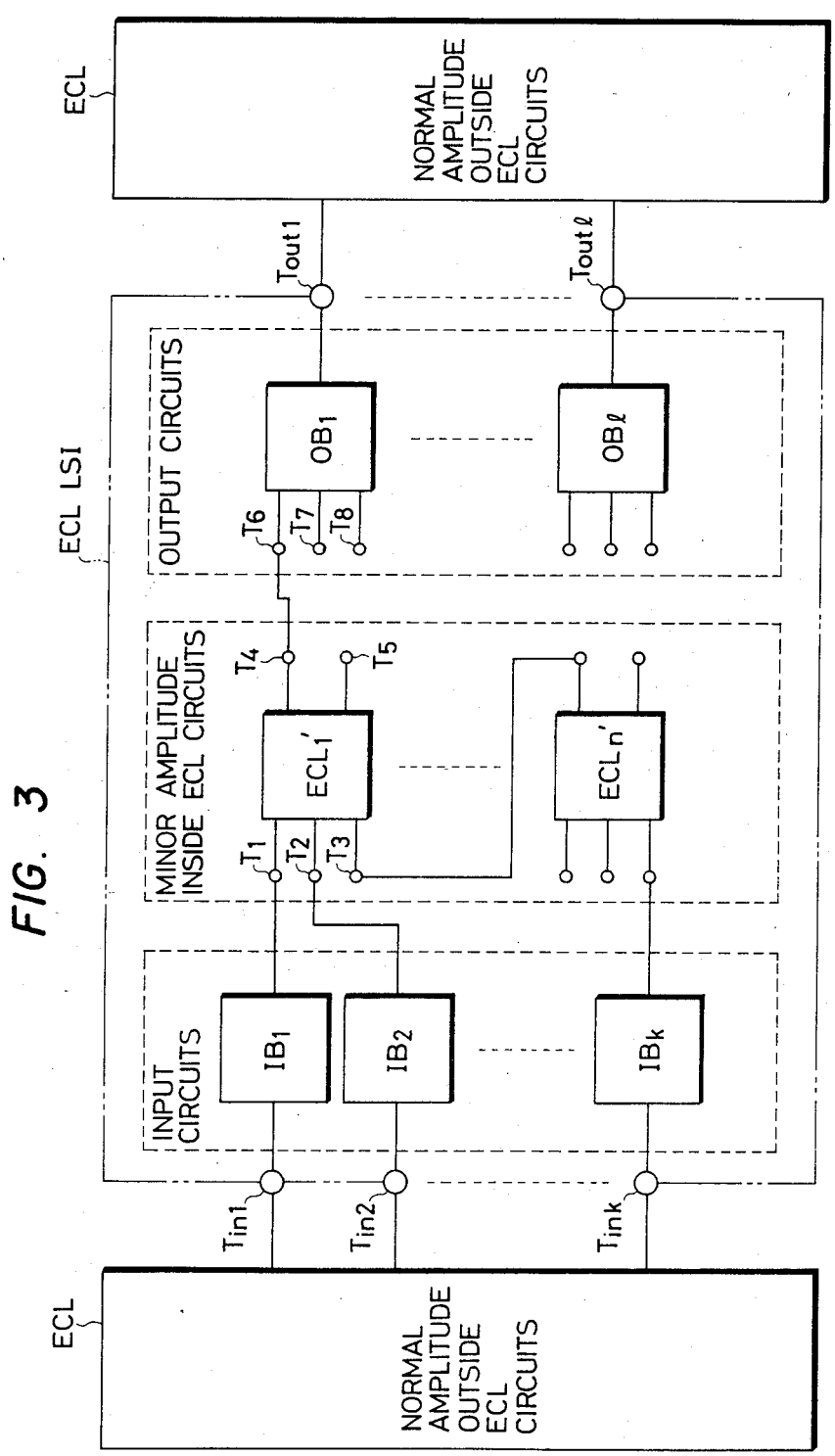
FIG. 3 is a block diagram showing a semiconductor integrated circuit device according to one embodiment of the present invention.

FIG. 3 is a block diagram showing one embodiment of the ECL semiconductor integrated circuit device according to the present invention.

In the same figure, the portion ECL LSI, which is enclosed by two-dotted chain lines, is formed on one semiconductor substrate by the well-known semiconductor integrated circuit technique.

Terminals $T_{in1}$ to $T_{ink}$ and terminals $T_{out1}$ to $T_{outl}$ are used as the external terminals of that portion ECL LSI. There are also provided power terminals $V_{CC}$ (at 0 V), $V_{EE}$ (at $-4.5$ V) and $V_{TT}$ (at $-2.0$ V) for supplying the semiconductor integrated circuit device ECL LSI with the supply voltages (although they are not shown).

The aforementioned terminals $T_{in1}$ to $T_{ink}$ are used as external input terminals, which are to be fed with input signals at the normal ECL level. The input signals which are to be fed from those terminals $T_{in1}$ to $T_{ink}$ are applied to the input terminals of input circuits $IB_1$ to $IB_k$ according to the present invention, respectively. These input circuits $IB_1$ to $IB_k$ generate output signals, which have their logic amplitudes reduced by shifting the low level of the aforementioned normal ECL signal toward the high level side while leaving the high level of the same signal as it is, and transmit those output signals to the predetermined input terminals of minor amplitude inside ECL circuits $ECL_1'$ to $ECL_n'$. These minor amplitude inside ECL circuits $ECL_1'$ to $ECL_n'$ are operated by a logic threshold voltage $V_{th}'$ according to the center value of the internal ECL signal, which has its level converted into the minor amplitude by the input circuits $IB_1$ to $IB_k$.

The circuit for generating the signal to be fed out of the ECL LSI is constructed of the output circuits $OB_1$ to $OB_l$. These output circuits $OB_1$ to $OB_l$ perform the predetermined logic operations in response to the aforementioned minor amplitude internal ECL signal and amplify and convert that signal into the aforementioned normal ECL signal level to feed the converted signal out of external terminals $T_{out1}$ to $T_{outl}$.

Figure 4A:
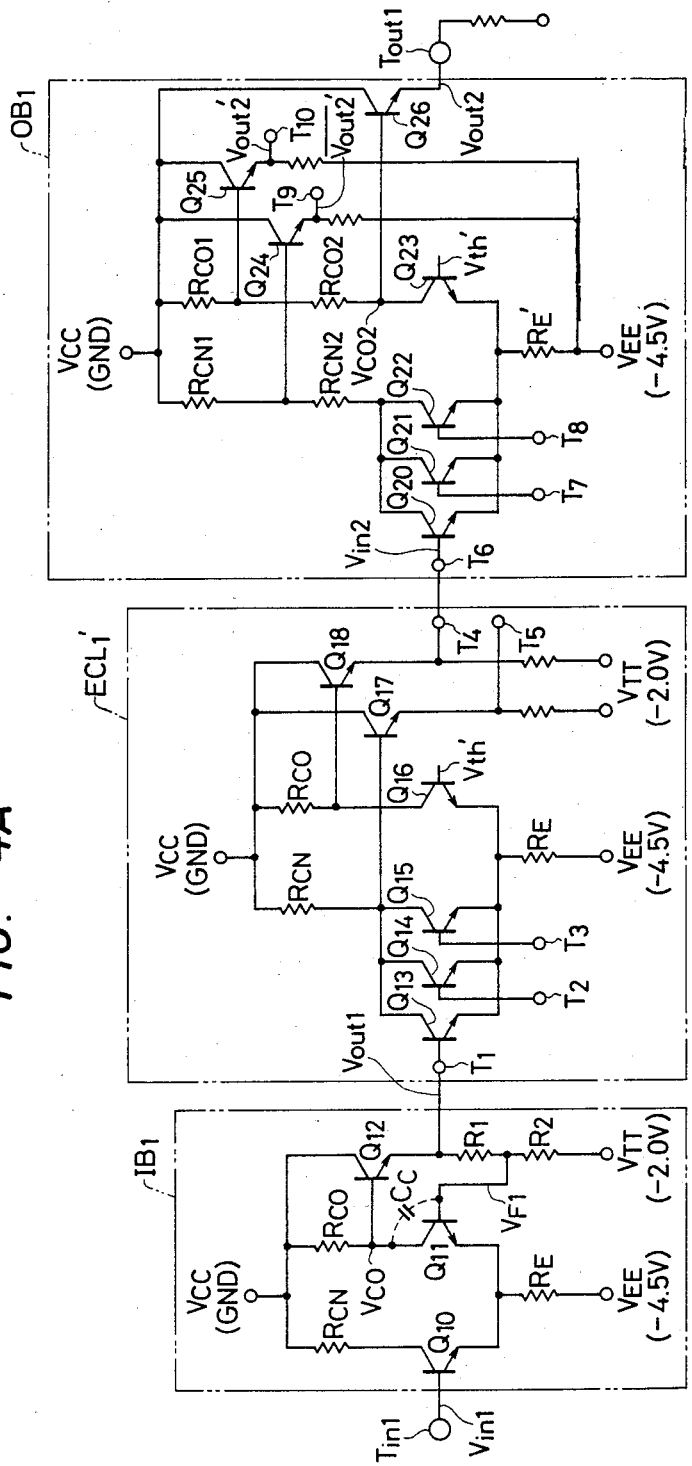
FIG. 4A is a circuit diagram showing one specific embodiment of the circuit device of FIG. 3.

FIG. 4A shows the circuit diagram of one embodiment of the aforementioned input circuit $IB_1$, minor amplitude inside ECL circuit $ECL_1'$ and output circuit $OB_1$. As shown in FIG. 4A, the input circuit $IB_1$ according to the present invention is constructed of a differential transistor circuit of negative feedback type. As will be explained hereinafter, this significantly speeds up the operation of the input circuit.

The constant current resistance $R_E$ is connected between the common emitter of differential transistors $Q_{10}$ and $Q_{11}$ and the power terminal $V_{EE}$. The collector resistors $R_{CN}$ and $R_{CO}$ are connected between the collectors of those transistors $Q_{10}$ and $Q_{11}$ and the power terminal $V_{CC}$, respectively.

The aforementioned transistor $Q_{10}$ is used as an input transistor and has its base connected with the external terminal $T_{in1}$. On the other hand, the aforementioned transistor $Q_{11}$ is used as a reverse input transistor and has its collector output voltage $V_{CC}$ transmitted to the base of an emitter follower transistor $Q_{12}$. Dividing resistances $R_1$ and $R_2$ are connected between the emitter of that transistor $Q_{12}$ and the power terminal $V_{TT}$. The output voltage $V_{out1}$ obtained from the emitter of the aforementioned transistor $Q_{12}$ is divided by the aforementioned dividing resistances $R_1$ and $R_2$, and the divided voltages are fed back to the base of the aforementioned reverse input transistor $Q_{11}$.

The relationship between the collector output voltage $V_{CC}$ of the reverse input transistor $Q_{11}$ and a voltage $V_{F1}$ to be fed back to the base of the same is expressed by the following Equations (2) and (3):

$$V_{F1} = V_{OUT1} - \frac{R_1}{R_1 + R_2}(V_{OUT1} - V_{TT}) \quad (2)$$

$$= V_{OUT1}\left(1 - \frac{R_1}{R_1 + R_2}\right) + \frac{R_1}{R_1 + R_2} \cdot V_{TT}$$

$$= \frac{R_2}{R_1 + R_2} \cdot V_{OUT1} + \frac{R_1}{R_1 + R_2} \cdot V_{TT}$$

$$= \frac{R_2}{R_1 + R_2}(V_{CO} - V_{BE}) + \frac{R_1}{R_1 + R_2} \cdot V_{TT}$$

$$\therefore \Delta V_{F1} = \Delta V_{CO}\frac{R_2}{R_1 + R_2} \quad (3)$$

As is apparent from the Equation (3), the ratio (i.e., the feedback ratio) $\Delta V_{F1}/\Delta V_{CO}$ of the change $\Delta V_{F1}$ of the base feedback voltage $V_{F1}$ to the change $\Delta V_{CO}$ of the collector output voltage $V_{CO}$ of the transistor $Q_{11}$ can be controlled by the divided voltage ratio $R_2/(R_1+R_2)$ established by the emitter dividing resistances $R_1$ and $R_2$ of the emitter follower transistor $Q_{12}$.

As a result of the above, it is possible to prevent a difficulty which can result if the feedback ratio is excessively high. More specifically, it is possible to prevent the difficulty that when the input voltage $V_{in1}$ applied to the base of the input transistor $Q_{10}$ is at the high or low level, the voltage difference $|V_{in1}-V_{F1}|$ between that input voltage $V_{in1}$ and the base feedback voltage $V_{F1}$ of the reverse input transistor $Q_{11}$ is not sufficient to ensure that the switching operations of the paired differential transistors $Q_{10}$ and $Q_{11}$ provides a stable output voltage $V_{CO}$ and acquire a desired level.

The input circuits $IB_1$ to $IB_k$ according to the present invention use the differential transistor circuits of negative feedback type, as has been described hereinbefore. In particular, rather than applying a fixed reference voltage to the base of the reverse input transistor $Q_{11}$, a voltage is applied which corresponds to the collector output voltage $V_{CO}$ of the reverse input transistor $Q_{11}$.

Figure 4B:
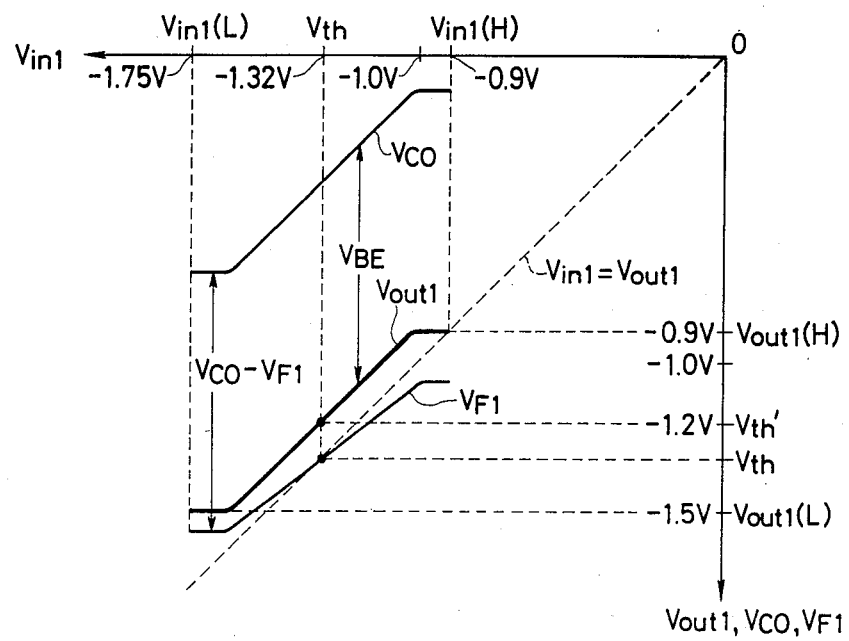
FIG. 4B is a diagram showing the input/output transmission characteristics of the input circuit of FIG. 4A.

As a result, as illustrated in the input/output transmission characteristic diagram of FIG. 4B, the voltage difference $|V_{CO}-V_{F1}|$ between the base and collector of the reverse input transistor $Q_{11}$ is held at a substantially constant level. Therefore, the parasitic capacity $C_O$ between the base and collector of that transistor $Q_{11}$ can be equivalently neglected. As a result, it is unnecessary to charge or discharge this parasitic capacity when the collector voltage $V_{CO}$ rises or breaks.

Thus, it is possible to shorten the transmission delay time, i.e., the time from when the input signal $V_{in1}$ rises (or breaks) to when the output signal $V_{out}'$ accordingly rises (or breaks).

A desired effect is obtained especially from the fact that the capacity of a relatively high level between the base and the collector can be equivalently neglected as the parasitic capacity of the bipolar transistor.

According to the experiments of the inventors, the input circuit $IB_1$ according to the present invention has a transmission delay time of about 0.1 nanosecs. In case the normal ECL circuit (having its reference voltage fixed) is used as that input circuit, the transmission delay time is about 0.3 nanosecs, as has been described hereinbefore. Thus, by applying the circuit according to the present invention, the time required in the input circuit is shortened to one third of the prior art.

Thanks to the provision of the negative feedback loop, moreover, the input circuit of the present invention has another advantage that it can stand disturbances such as the fluctuations in the power source or dispersion of the element characteristics. In fact, utilizing the present invention, the input circuit is hardly subjected to such influences at all.

In addition, when the input voltage $V_{in1}$ to be applied to the base of the input transistor $Q_{10}$ takes the center value $V_{th}$ between the high level $V_{in1}(H)$ and the low level $V_{in1}(L)$, the output voltage $V_{out1}$ can be set at the center value $V_{th}'$ between the high level $V_{out1}(H)$ and the low level $V_{out}(L)$. The effect obtained from satisfying this relationship is as follows:

When the input voltage $V_{in1}$ is at the low (or high) level side from the center value $V_{th}$ between its high level $V_{in1}(H)$ and low level $V_{in1}(L)$, the output voltage $V_{out1}$ is likewise shifted to the low (or high) level side from the center value $V_{th}'$ between its high level $V_{out1}(H)$ and low level $V_{out1}(L)$. As a result, the signal to be judged to be at the low (or high) level side from the standpoint of the input side is prevented from being misjudged as being at the high (or low) level side from the standpoint of the output side. In short, a proper noise margin is obtained so that malfunctions due to noise can be reduced.

Although not necessarily limited thereto, the signal level conversion (i.e., to the minor amplitude) at the aforementioned input circuit $IB_1$ can be set as is illustrated in the input/output transmission characteristic diagram of FIG. 4B.

The external ECL signal $V_{in1}$ has a high level $V_{in1}(H)$ of $-0.9$ V, a low level $V_{in1}(L)$ of $-1.75$ V and a center value of about $-1.32$ V. In response to the signal $V_{in1}$, as shown in thick solid line in the same figure, an output signal $V_{out1}$ is generated which has a minor amplitude such that its center value (i.e., the internal logic threshold voltage $V_{th}'$) is $-1.2$ V, its high level $V_{out1}(H)$ is $-0.9$ V and its low level $V_{out1}(L)$ is $-1.5$ V.

In the same figure, the difference in the gradients between the characteristic curves of the base feedback voltage $V_{F1}$ of the reverse input transistor, as shown in a thin solid line, and the aforementioned output voltage $V_{out1}$, as indicated in the thick solid line, is determined by the aforementioned dividing resistance ratio $R_2/(R_1+R_2)$.

The signal $V_{out1}$ having had its level converted by the aforementioned input circuit $IB_1$ is transmitted to the input terminal $T_1$ of the inside ECL circuit $ECL_1$.

The construction of this inside ECL circuit $ECL_1$ is similar to that of the well-known ECL circuit except for the following points. Accordingly, a detailed explanation of the inside ECL operation will be omitted here except for the following differences from conventional operation.

The inside ECL circuit $ECL_1$ of FIG. 4A receives a signal which has its amplitude reduced to a minor level by the aforementioned input circuit. The circuit according to the embodiment under consideration has its output signal amplitude and its signal level made coincident with those of the aforementioned minor amplitude signal $V_{out1}$ by making the ratios $R_{CN}/R_E$ and $R_{CO}/R_E$ of the paired load resistances $R_{CN}$ and $R_{CO}$ to the constant current resistance $R_E$ somewhat smaller than those of a normal ECL circuit.

Figure 2A:
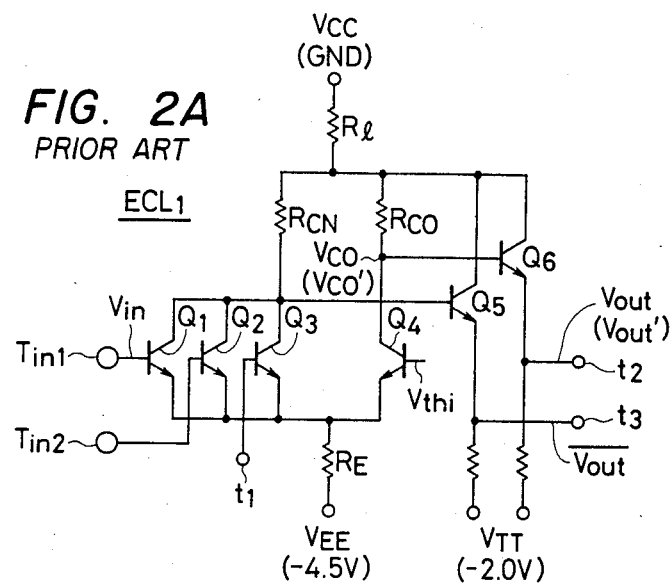
FIG. 2A is a circuit diagram showing one example of the inside ECL circuit of the circuit device of FIG. 1.
Figure 2B:
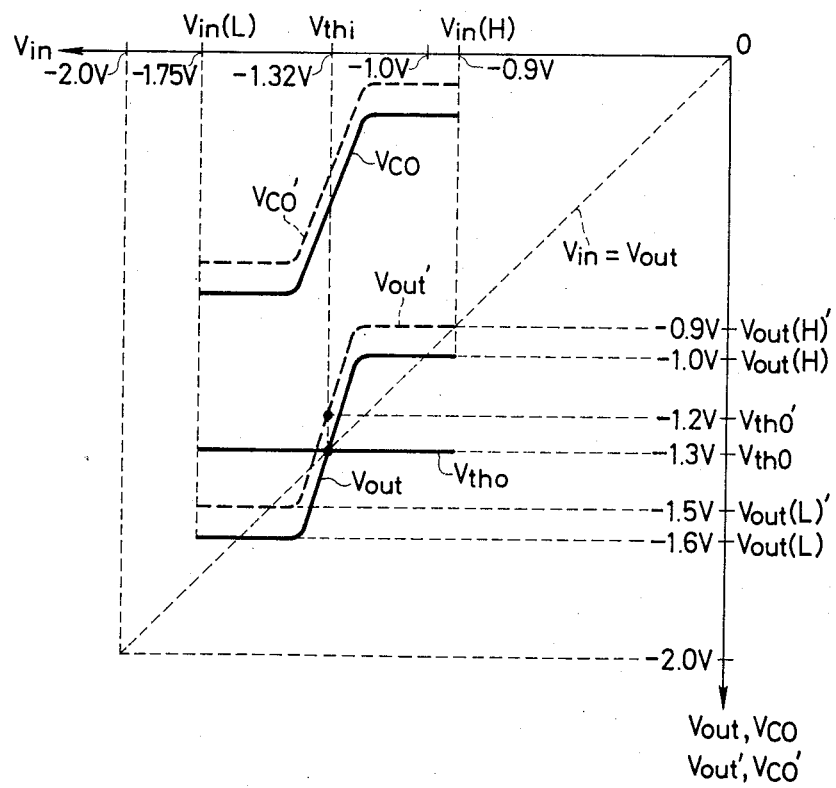
FIG. 2B is a diagram showing the input/output transmission characteristics of the inside ECL circuit of FIG. 2A.

In accordance with this, the logic threshold voltage $V_{th}'$ is set at the center value (i.e., $-1.2$ V) of the aforementioned minor amplitude signal $V_{out1}$. As can be seen, this is different from the logic threshold voltage $V_{th}$ (e.g., about $-1.32$ V) of the aforementioned external ECL signal. The output signals of the inside ECL circuits $ECL_1$ to $ECL_n$ have their amplitudes made minor by shifting the low level of the external ECL signal $V_{in1}$ or the like toward the high level side while leaving the high level (i.e., $-0.9$ V) of the same as it is. Thus, the inside ECL circuits $ECL_1$ to $ECL_n$ need not be provided with the level shifting resistance $R_l$, as shown in FIG. 2A.

Moreover, the output circuit $OB_1$ for generating the normal amplitude ECL signal to be fed out of the LSI is constructed of an ECL circuit which has an additional function of enlarging the amplitude of the internal ECL signal $V_{in2}$ to that of the external ECL signal $V_{out2}$.

This output circuit $OB_1$ is operated with an internal logic threshold voltage $V_{th}'$ because it receives the aforementioned minor amplitude internal ECL signal.

Figure 4C:
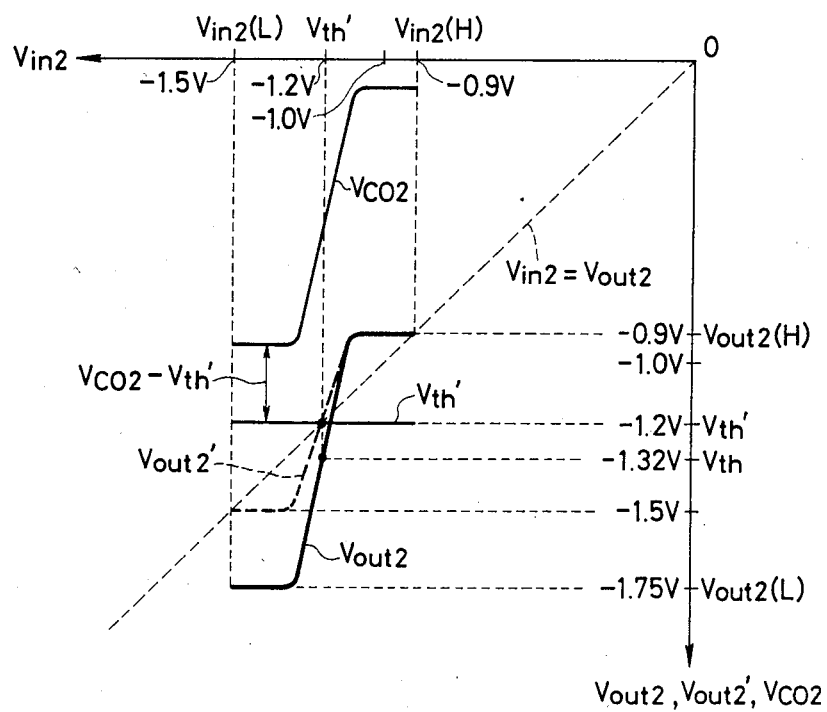
FIG. 4C is a diagram showing the input/output transmission characteristics of the output circuit of FIG. 4A.

Further, in order for the center value and the low level of the output signal $V_{out2}$ to be shifted (or enlarged) toward the low level side, as illustrated in FIG. 4C, the ratios $(R_{CN1}+R_{CN2})/R_E'$ and $(R_{CO1}+R_{CO2})/R_E'$ of the collector load resistances $(R_{CN1}+R_{CN2})$ and $(R_{CO1}+R_{CO2})$ of paired differential transistors $Q_{22}$ and $Q_{23}$ to the constant current resistance $R_E'$ which is connected to the common emitter of those transistors are set at relatively high levels, as compared with those of the normal ECL circuit.

Incidentally, the reason why the collector load resistances are respectively divided into $R_{CN1}$ and $R_{CN2}$, and $R_{CO1}$ and $R_{CO2}$ is that it is intended to use the divided voltages, which are generated by those dividing resistances, as signals for the inside ECL circuits. The divided voltages thus generated are applied to the bases of emitter follower transistors $Q_{24}$ and $Q_{25}$, respectively, from which minor amplitude output signals $\overline{V_{out2}'}$ and $V_{out2}'$ are generated for the inside ECL circuits from the emitter output terminals $T_9$ and $T_{10}$ of those transistors $Q_{24}$ and $Q_{25}$. That signal $V_{out2}'$ is illustrated in a thin dashed line in FIG. 4C.

The semiconductor integrated circuit (ECL LSI) thus far described uses the differential transistor circuits of negative feedback type as its input circuits $IB_1$ to $IB_k$ so that its operating speed can be remarkably improved.

More specifically, the time from when the input signal is applied to the input circuit of that ECL LSI to when the signal corresponding to that input signal is applied to the output circuit of the same is about 1.5 $(0.1-1.4=1.5)$ nanosecs, as has been described hereinbefore. In the case of the prior art circuit, on the other hand, the time corresponding to the aforementioned one is about 1.7 $(0.3+1.4=1.7)$ nanosecs, as has also been described. As a result, the operating speed of the ECL LSI can be improved by at least about 12 $((1.7-0.15)/1.7 \approx 0.12)$ %.

Thanks to the provisions of the input circuits $IB_1$ to $IB_k$, furthermore, the signal amplitude is reduced by shifting the center value $V_{th}$ and the low level $V_{in1}(L)$ of the external ECL signal toward the high level side while leaving the high level $V_{in1}(H)$ of the same as it is. As a result, the minor amplitude internal ECL circuits $ECL_1$ to $ECL_n$ can generate the output signals, which are coincident with the aforementioned minor amplitude internal ECL signals, without any provision of the level shifting resistance $R_l$. Thus, it is possible to realize a great improvement in the integration of the device because the level shifting resistance $R_l$ for each of the numeral ECL gate circuits can be eliminated.

Furthermore, the power consumption can also be reduced by eliminating the useless power which is consumed by the level shifting resistors $R_l$ in FIG. 2A. Incidentally, it goes without saying that the inside ECL circuits realize a speed-up of their operations by reducing their signal amplitudes.

In the inside ECL circuits, incidentally, the circuit of the present embodiment can have its supply voltage reduced by the elimination of the aforementioned level shifting resistances $R_l$. If the power consumption is made similar with the reduced supply voltage to that which occurs when the aforementioned resistances $R_l$ are provided, however, the operating current of each inside ECL circuit can be increased. As a result, if the power consumption is made equal with the reduced supply voltage to that which occurs when the level shifting resistances $R_I$ are provided, the operating speed of the inside ECL circuit can be further accelerated.

Figure 5A:
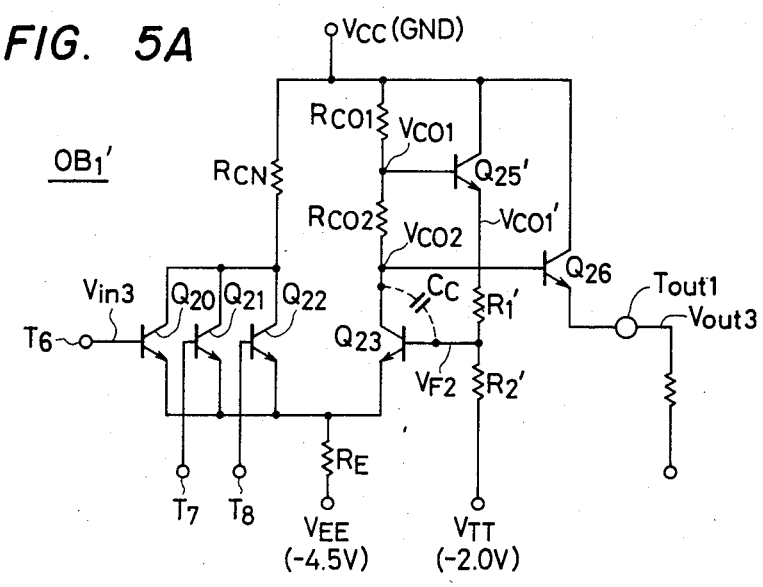
FIG. 5A is a circuit diagram showing another embodiment of an output circuit in accordance with the present invention.

FIG. 5A is a circuit diagram showing another example of an output circuit in accordance with the present invention.

In this embodiment, the operating speed of the output circuit can be increased by adopting a differential transistor circuit of negative feedback type similar to that discussed previously for the input circuit $IB_1$.

In the present embodiment, specifically, a feedback voltage $V_{F2}$ is applied to the base of the reverse input transistor $Q_{23}$. This differs from the constant circuit $OB_1$ of FIG. 4A, which is operated by the fixed reference voltage $V_{th}'$ applied to the base of $Q_{23}$. The dividing resistances $R_{CO1}$ and $R_{CO2}$ are connected with the collector of the reverse input transistor $Q_{23}$. Moreover, the divided voltage $V_{CO1}$ produced by those dividing resistances is applied to the base of an emitter follower transistor $Q_{25}'$. Dividing resistances $R_1'$ and $R_2'$ are connected between the emitter of the transistor $Q_{25}'$ and the power terminal $V_{TT}$. The emitter output voltage $V_{CO1}'$ of this emitter follower transistor $Q_{25}'$ is divided by the dividing resistances $R_1'$ and $R_2'$ and is applied as the feedback voltage $V_{F2}$ to the base of the reverse input transistor $Q_{23}$.

The arrangement of FIG. 5A is particularly designed to produce a normal amplitude output signal $V_{out3}$ for passing to an outside ECL circuit which operates at a normal ECL amplitude level rather than a minor ECL amplitude level. This output signal $V_{out3}$ is produced at the external $T_{out1}$, and is generated through an emitter follower transistor $Q_{26}$ which receives the collector voltage $V_{CO2}$ of the aforementioned reverse input transistor $Q_{23}$.

The circuit of this embodiment of FIG. 5A can convert the minor amplitude input signal $V_{in3}$ to the normal ECL signal level by suitably setting the aforementioned respective dividing resistance ratios. Specifically, in order for the output signal $V_{out3}$ to be at the normal ECL signal level, as illustrated in the input/output transmission characteristic diagram of FIG. 5B, the center value and the low level of the input signal are shifted toward the low level side while leaving the high level as it is. This reduction in the level can be controlled, as will be described hereinafter, by the resistance ratios of the collector load resistances $R_{CO1}$ and $R_{CO2}$ of the reverse input transistor $Q_{23}$ to the resistances $R_1'$ and $R_2'$.

The relationship between the collector voltage $V_{CO2}$ of the reverse input transistor $Q_{23}$ and the feedback voltage $V_{F2}$ fed to the base of the same is expressed by the following Equations (4) to (7).

$$V_{CO1} = \frac{R_{CO1}}{R_{CO1} + R_{CO2}} \cdot V_{CO2} \quad (4)$$

$$V_{CO1}' = V_{CO1} - V_{BE} \quad (5)$$

$$= \frac{R_{CO1}}{R_{CO1} + R_{CO2}} V_{CO2} - V_{BE}$$

$$V_{F2} = V_{CO1}' - \frac{R_1'}{R_1' + R_2'} (V_{CO1}' - V_{TT}) \quad (6)$$

$$= V_{CO1}' \left(1 - \frac{R_1'}{R_1' + R_2'}\right) + \frac{R_1'}{R_1' + R_2'} \cdot V_{TT}$$

$$= \frac{R_2'}{R_1' + R_2'} \cdot V_{CO1}' + \frac{R_1'}{R_1' + R_2'} \cdot V_{TT}$$

$$= \frac{R_2'}{R_1' + R_2'} \left(\frac{R_{CO1}}{R_{CO1} + R_{CO2}} \cdot V_{CO2} - V_{BE}\right) -$$

$$\frac{R_1'}{R_1' + R_2'} \cdot V_{TT}$$

$$= \frac{R_2'}{R_1' + R_2'} \cdot \frac{R_{CO1}}{R_{CO1} + R_{CO2}} \cdot V_{CO2} - \frac{R_2'}{R_1' + R_2'} \cdot$$

$$V_{BE} + \frac{R_1'}{R_1' + R_2'} \cdot V_{TT}$$

$$\therefore \Delta V_{F2} = \Delta V_{CO2} \cdot \frac{R_2'}{R_1' + R_2'} \cdot \frac{R_{CO1}}{R_{CO1} + R_{CO2}} \quad (7)$$

From the Equation (7), it is apparent that the ratio (i.e., the feedback ratio) $\Delta V_{F2}/\Delta V_{CO2}$ of the change $\Delta V_{F2}$ in the base feedback voltage $V_{F2}$ to the change $\Delta V_{CO2}$ in the collector output voltage $V_{CO2}$ of the reverse input transistor $Q_{23}$ can be controlled by both the voltage dividing ratio $R_2'/(R_1'+R_2')$ of the emitter resistances $R_1'$ and $R_2'$ of the emitter follower transistor $Q_{25}$ and the voltage dividing ratio $R_{CO1}/R_{CO1}+R_{CO2})$ of the collector load resistances $R_{CO1}$ and $R_{CO2}$. As a result, by properly setting these ratios, it is possible to ensure that the feedback ratio will not be excessively high.

Figure 5B:
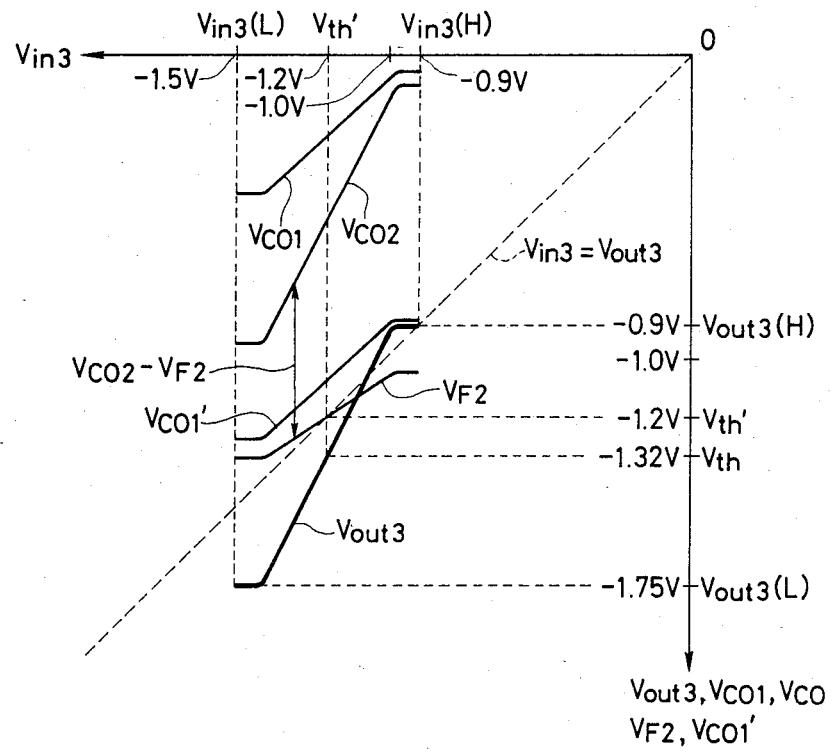
FIG. 5B is a diagram showing the input/output transmission characteristics of the output circuit of FIG. 5A.

As illustrated in FIG. 5B, moreover, when the voltage of the minor amplitude inside ECL signal to be applied to the base of an input transistor $Q_{20}$ or the like is at the center value (i.e., the logic threshold voltage) between the high level $V_{in3}(H)$ and the low level $V_{in3}(L)$, the output voltage $V_{out3}$ can be set at the center value $V_{th}$ between its high level $V_{out3}(H)$ and low level $V_{out3}(L)$. The effect which is obtainable as a result of satisfying the above relationship is similar to the effect obtainable in aforementioned input circuit $IB_1$.

On the other hand, the output circuit $OB_1'$ of the present embodiment of FIG. 5A has the base of its reverse input transistor $Q_{23}$ fed with the feedback voltage $V_{F2}$ illustrated in FIG. 5B. This is different than the case of FIG. 4A in which the reverse input transistor $Q_{23}$ of the output circuit $OB_1$ has its base fed with the fixed reference voltage $V_{th}'$. As a result, the varying range of the voltage difference $|V_{CO2}-V_{F2}|$ between the base and collector of the reverse transistor $Q_{23}$ can be reduced in the FIG. 5A embodiment. Therefore, since the value of the parasitic capacity $C_C$ between the base and collector of the aforementioned transistor $Q_{23}$ can be apparently reduced, the rising and breaking speeds of the collector output signal $V_{CO2}$, accordingly, of the output signal $V_{out3}$ can be accelerated so that the signal transmission delay time at the output circuit $OB_1'$ can be shortened.

As a result, when the output circuit $OB_1'$ of the present embodiment is used in place of the output circuit $OB_1$ of FIG. 4, those speeds can be further accelerated. Also, similar to the aforementioned input circuit, another advantage is attained in that the circuit of the present embodiment is less influenced by disturbances such as fluctuations in the power source and dispersions in the element characteristics.

If desired, the output circuit can be prepared using the circuit elements of the output circuit $OB_1$ of FIG. 4A with connections being provided between the elements to change to interconnection by a master switch system in accordance with the desired application. In other words, when it is necessary for the minor amplitude inside ECL signals to be generated by the output circuit, the circuit elements can be connected to form the output circuit $OB_1$ shown in FIG. 4A. On the other hand, when it is unnecessary to generate the aforementioned minor amplitude inside ECL signals, the high-speed output circuit $OB_1'$ shown in FIG. 5A can be formed by changing the connections by the master switch system. Of course, an alternative to this would be that the output circuit $OB_1'$ of FIG. 5A could be modified by adding an emitter follower circuit for generating the minor amplitude inside ECL signal.

The present invention should not be limited to the embodiments thus far described.

For example, in the input circuit of FIG. 4A, the collector resistance $R_{CN}$ of the input transistor $Q_{10}$ may be omitted if it is necessary to reduce the number of the circuit elements. However, it is generally desired to include the resistance $R_{CN}$ for the following reasons.

Specifically, the resistance $R_{CN}$ applies a signal voltage at a suitable level to the collector of the transistor $Q_{10}$ thereby to establish a suitable mirror capacity in the transistor $Q_{10}$. Thanks to the fact that the transistor $Q_{10}$ has an input capacity corresponding to the mirror capacity, the high-frequency noise which might otherwise be imparted to the input terminal can be attenuated to an excellent extent. As a result, the circuit can be made substantially insensitive to this noise without having its operating speed substantially decelerated.

In addition to this advantage, when the resistor $R_{CN}$ is provided, it can be ensured that a sufficient inside ECL signal is generated as the collector output signal of the transistor $Q_{10}$ for coupling through the emitter follower transistor $Q_{12}$ which will reverse this inside ECL signal.

Another possible change is that the inside ECL circuit may be modified such that a constant-current transistor is connected with the common emitter of the paired differential transistors constructing the ECL circuit. Also, if desired, the center value and the low level of the minor amplitude inside ECL signal may be shifted toward the higher level side in accordance with the operating margin of the inside ECL circuit thereby to have its amplitude further reduced.

Figure 1:
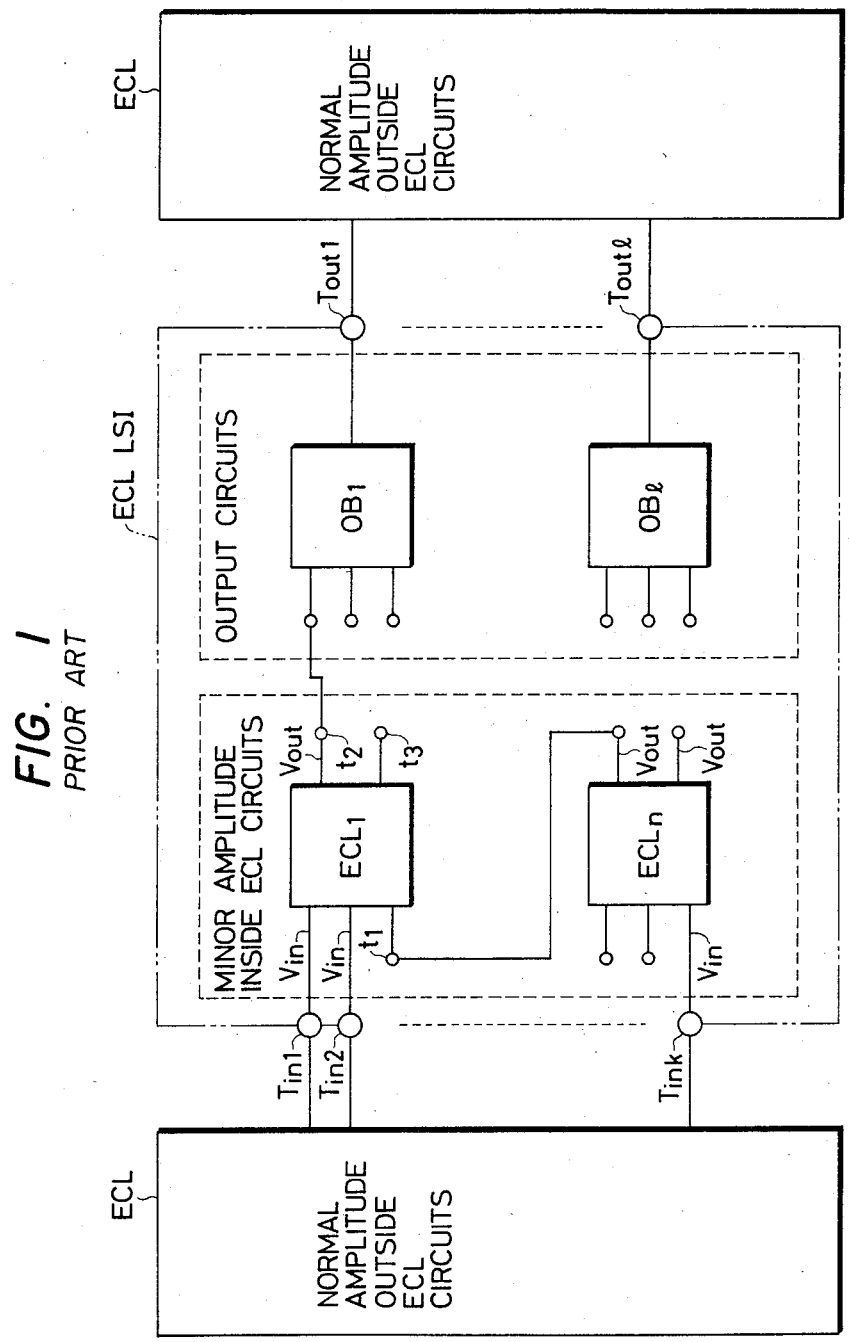
FIG. 1 is a block diagram showing an ECL integrated circuit device which does not have a special input circuit for an inside ECL circuit.

Another embodiment of the present invention is that the output circuit $OB_1'$ of FIG. 5A may be used in the output circuit of the ECL integrated circuit device of FIG. 1 so that its high-speed operation can be realized.

FIGS. 6 to 9 show other embodiments of the input circuit according to the principle of the present invention.

Figure 6:
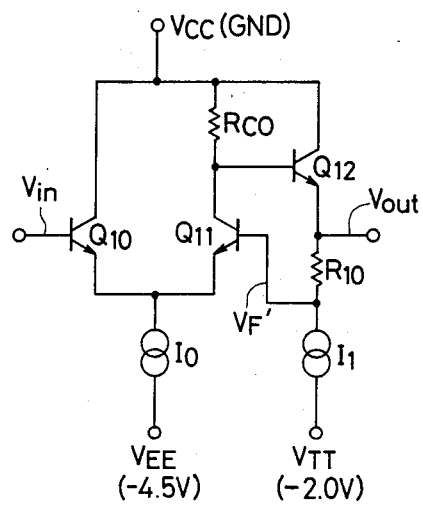
FIGS. 6 to 9 are circuit diagrams showing other embodiments of input circuits in accordance with the present invention.

The circuit shown in FIG. 6 is modified from the input circuit of FIG. 4A such that the dividing resistances $R_1$ and $R_2$ are replaced by a resistance $R_{10}$ and a contant-current source $I_1$. Such constant-current sources per se are well known in the art. The constant-current source $I_0$ in the input circuit is constructed similarly to that in the prior art ECL circuit. Specifically, the constant-current source $I_0$ is constructed of a constant-current transistor which has its collector connected with the common emitter of the transistors $Q_{10}$ and $Q_{11}$ and its emitter connected with a power terminal through a resistance having a suitable value. The base of the constant-current transistor is fed with the reference voltage which is generated from a suitable reference voltage generating circuit. A constant-current source $I_1$ is also made to have a similar construction to that of the constant-current source $I_0$.

Since, in this circuit, the current $I_1$ to flow through the resistance $R_{10}$ is constant, the voltage drop at the resistance $R_{10}$ is held constant at all times. As a result, the voltage between the base and the collector of the reverse input transistor $Q_{11}$ has a substantially constant value which is determined by both the constant voltage drop $I_1R_{10}$ at the aforementioned resistor $R_{10}$ and the emitter-base constant voltage of the emitter follower transistor $Q_{12}$. As a result, this circuit can have its operating speed (i.e., the transmission delay time) further improved because the parasitic capacity between the base and collector of the reverse input transistor $Q_{11}$ can be substantially completely neglected.

In this circuit, moreover, the switching operations of the paired differential transistors $Q_{10}$ and $Q_{11}$ can be completely performed in response to the input signal $V_{in}$ by setting the aforementioned voltage drop $I_1R_{10}$ and the respective element constants of the circuit at proper values. Furthermore, when the input signal $V_{in}$ is at its center level, the output signal $V_{out}$ can be set at that center level.

Figure 7:
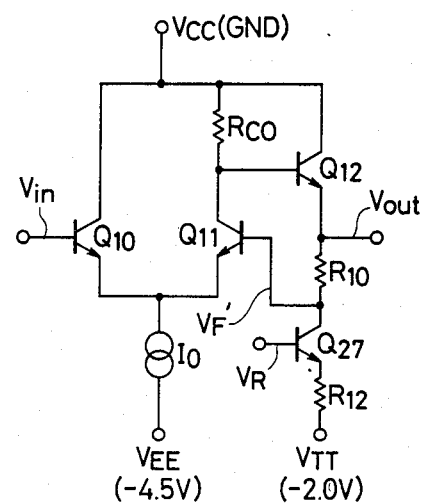

The circuit shown in FIG. 7 is modified such that the constant-current source $I_1$ of the input circuit shown in FIG. 6 is replaced by a specific circuit. In this circuit, the aforementioned constant-current source $I_1$ is constructed of a constant-current transistor $Q_{27}$ and an emitter resistance $R_{12}$. A suitable reference voltage $V_R$ is fed to the base of the aforementioned constant-current transistor $Q_{27}$.

Figure 8:
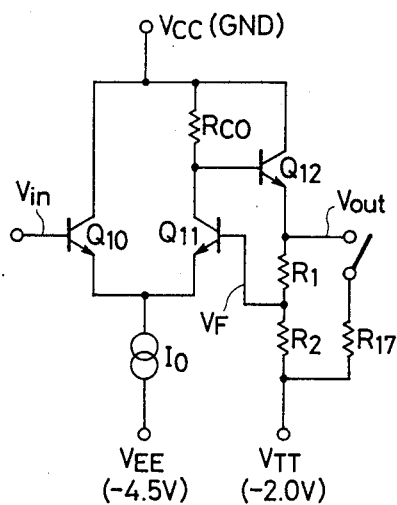

The input circuit shown in FIG. 8 is modified such that a resistance $R_{17}$ can be connected in parallel with the voltage dividing resistances $R_1$ and $R_2$ of the input circuit shown in FIG. 4A. The resistance $R_{17}$ is connected in parallel with the dividing resistances $R_1$ and $R_2$, if desired, by the master switch system, for example. As a result of this connection of the resistance $R_{17}$, the emitter follower transistor $Q_{12}$ can have its emitter composed resistance reduced so that its driving capacity can be improved. Accordingly, this input circuit can be prevented from having its operating speed decreased even when it drives a relatively high load.

Figure 9:
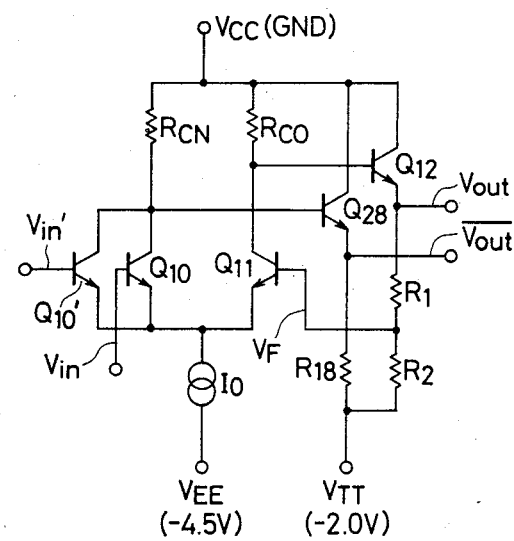

The input circuit shown in FIG. 9 is modified such that there is disposed in the input circuit of FIG. 4A an emitter follower transistor $Q_{28}$ which is made receptive of the collector output signal of the input transistor $Q_{10}$ thereof. This circuit is capable of generating the minor amplitude signals $V_{out}$ and $\overline{V_{out}}$ having opposite phases in response to the input signal $V_{in}$.

Incidentally, a pair of input transistors may be disposed in the input circuit, as shown in FIG. 9, if desired. These plural input transistors $Q_{10}$ and $Q_{11}'$ have their collectors and emitters commonly connected with each other and their bases fed with input signals $V_{in}$ and $V_{in}'$. Thanks to the provision of such plural input transistors, a logic arrangement can be constructed of the input circuit.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor integrated circuit device comprising:
    an input terminal for receiving an input signal having a high voltage level and a low voltage level;
    an input circuit including a first transistor having its base coupled to said input terminal to receive said input signal through said input terminal and its collector coupled to a first power source terminal, a second transistor having an emitter coupled to an emitter of said first transistor to perform current switching operations with said first transistor, a load element connected between the collector of sid second transistor and the first power source terminal, a current source element connected between the emitters of said first and second transistors and a second power source terminal, a bias circuit coupled to receive a collector output of said second transistor including means for generating a bias voltage to be fed to the base of said second transistor, and an output terminal coupled to the collector of said second transistor, wherein said load element and said bias circuit have circuit parameters which are set so that said input circuit generates an output signal at said output terminal which has a high voltage level substantially equal to the high voltage level of said input signal and a low voltage level higher than the low voltage level of said input signal; and
    an ECL circuit coupled between the first power source terminal and the second power source terminal for receiving said output signal from said output terminal of said input circuit.

2. A semiconductor integrated circuit device according to claim 1, wherein said ECL circuit includes: a third transistor having a collector coupled to the first power source terminal, an emitter and a base, said base being coupled to the output terminal of the input circuit to be fed with said output signal from said input circuit; a fourth transistor having a collector coupled to the first power source terminal, an emitter coupled to the emitter of said third transistor, and a base coupled to a threshold voltage source to be fed with a threshold voltage which is at a higher level than a threshold voltage necessary for recognizing the high and low levels of the input signal fed to said input terminal; and a current source element connected between the emitters of said first and second transistors and the second power source terminal.

3. A semiconductor integrated circuit device according to claim 2, wherein said bias circuit has a level shift element connected between the collector and base of said second transistor.

4. A semiconductor integrated circuit device according to claim 2, wherein said bias circuit further includes an emitter follower transistor having a base coupled to the collector of said second transistor, an emitter coupled to the base of said second transistor, and a collector coupled to the first power source terminal, and wherein said bias circuit is constructed of a level shift circuit coupled to receive the emitter output of said emitter follower transistor for generating a voltage to be fed to the base of said second transistor.

5. A semiconductor integrated circuit device according to claim 4, wherein said level shift circuit has a first resistance element connected between the emitter of said emitter follower transistor and the base of said second transistor, and a second resistance element connected between the base of said second transistor and a third power source terminal and wherein said output terminal is coupled between the emitter of said follower transistor and said first resistance element.

6. A semiconductor integrated circuit device according to claim 4, wherein a collector load resistance element is connected between the collector of said first transistor and the first power source terminal.

7. A semiconductor integrated circuit device according to claim 1, further comprising:
    an output circuit coupled to receive an output signal of said ECL circuit and including means for generating an output signal which has high and low voltage levels corresponding to the high and low voltage levels of said input signal applied to said input terminal, respectively; and
    an output terminal coupled to be fed with the output signal of said output circuit.

8. A semiconductor integrated circuit device according to claim 7, wherein said output circuit includes a fifth transistor for current switching operations, a level shift element coupled to the collector of said fifth transistor, a collector load resistance element coupled between said level shift element and said first power source terminal, and an emitter follower transistor having a base coupled to a common connection between said collector load resistance and said level shift element, a collector coupled to said first power source terminal and an emitter coupled to said second power source terminal through an emitter resistance, whereby a signal which has high and low voltage levels corresponding to the high and low voltage levels of said output signal of said input circuit is generated from said emitter.

9. A semiconductor integrated circuit device according to claim 8, wherein the level shift element of said output circuit is made of a resistance element.

10. A semiconductor integrated circuit device according to claim 9, wherein said output circuit further includes: an emitter follower transistor having a base coupled to the collector of said fifth transistor and an emitter coupled to an output terminal.

11. A semiconductor integrated circuit device comprising:
    an input terminal;
    an ECL circuit coupled to said input terminal including means coupled between a first power source terminal and a second power source terminal for generating an output signal having high and low voltage levels corresponding to the high and low voltage levels of an input signal fed to said input terminal;
    an output circuit coupled to receive said ECL output signal including a first current switch transistor to be controlled by the output signal of said ECL circuit, a level shift element coupled to the collector of said current switch transistor, and a resistance element connected between said level shift element and the first power source terminal, wherein said output circuit generates an output signal which has a high voltage level made substantially equal to the high voltage level of the output signal of said ECL circuit and a low voltage level made lower than the low voltage level of the output signal of said ECL circuit; and an output terminal coupled to be fed with an output signal which is generated at the common connection between the collector of said first current switch transistor and said level shift element.

12. A semiconductor ECL integrated circuit device comprising:

an input terminal coupled to receive an input signal from an outside ECL circuit, said input signal having a high voltage level and a low voltage level;

an input circuit coupled to said input terminal including means for converting said input signal into a first minor amplitude ECL signal having an amplitude smaller than that of said input signal, said input circuit comprising a first transistor having its base fed with said input signal through said input terminal and its collector coupled to a first power source terminal, a second transistor having an emitter coupled to the emitter of said first transistor to perform current switching operations with said first transistor, a load element connected between the collector of said second transistor and the first power source terminal, a current source element connected between the emitters of said first and second transistors and a second power source terminal, a negative feedback bias circuit coupled to receive the collector output of said second transistor, said bias circuit including means for generating a bias voltage corresponding to the collector voltage of said second transistor to be fed to the base of said second transistor, and an output terminal coupled to the collector of said second transistor, wherein said load element and said bias circuit have circuit parameters which are set so that said input circuit generates said first minor amplitude ECL signal at said output terminal which has a high voltage level substantially equal to the high voltage level of said input signal and a low voltage level higher than the low voltage level of said input signal, and so that the difference between the collector output voltage $V_{CO}$ of the second transistor and a base feedback voltage $V_{F1}$ to the base of the second transistor remains substantially constant;

an ECL circuit coupled to said output terminal of said input circuit for receiving said first minor amplitude ECL output signal and coupled between the first and the second power source terminal, said ECL circuit including means for operating in response to said first minor amplitude output signal from said input circuit to produce a second minor amplitude ECL output signal having high and low voltage levels corresponding to the high and low voltage levels of the first minor amplitude output signal of said input circuit.

13. A semiconductor ECL integrated circuit device according to claim 12, wherein the negative feedback bias circuit comprises a negative feedback transistor and a pair of resistors coupled in series between an emitter of the negative feedback transistor and a third power source terminal, the base of said negative feedback transistor being coupled to the collector of the second transistor, the base of the second transistor being coupled to a junction between said pair of resistors, and the output terminal for the input circuit being coupled between the emitter of the negative feedback transistor and the pair of resistors.

14. A semiconductor ECL integrated circuit device according to claim 12, further comprising:

an output circuit coupled to receive the second minor amplitude ECL output signal from the ECL circuit comprising:

a third transistor having a base coupled to receive said second minor amplitude output signal from said ECL circuit;

a load element coupled between the first power source terminal and a collector of said third transistor;

a fourth transistor having an emitter coupled to an emitter of the third transistor to operate as a current switch in conjunction with the third transistor;

a load element coupled between the first power source terminal and a collector of said fourth transistor;

a current source element coupled between the emitters of said first and second transistors and the second power source terminal; and an output terminal coupled to the collector of said fourth transistor, wherein parameters of said load elements are set so that an output signal is produced at the output terminal of said output circuit having high and low levels equal to the high and low levels of an input signal applied to the input terminal of the ECL integrated circuit.

15. A semiconductor ECL integrated circuit device according to claim 14, further comprising:

a fixed reference voltage source applied to a base of said fourth transistor;

first and second resistors coupled in series to a collector of said third transistor;

third and fourth resistors coupled in series to a collector of said fourth transistor;

a first emitter follower transistor coupled to a junction of said first and second resistors, said first emitter follower transistor having an output terminal at its emitter;

a second emitter follower transistor coupled to a junction of said third and fourth resistors, said second emitter follower transistor having an output terminal at its emitter; and a fifth transistor having a base coupled to a collector of said fourth transistor and an emitter coupled to the output terminal for said output circuit, wherein the values of the first, second, third and fourth resistors are set so that a third minor amplitude ECL signal is produced at the output of the first emitter follower transistor and a fourth minor amplitude ECL signal is produced at the output of said second emitter follower transistor.

16. A semiconductor ECL integrated circuit device according to claim 14, further comprising:

a first resistor coupled to a collector of the third transistor;

second and third resistors coupled in series to a collector of the fourth transistor; and a negative feedback bias circuit coupled between a junction of the second and third resistors in a base of the fourth transistor, said negative feedback bias circuit comprising a fifth transistor and fourth and fifth resistors, wherein a base of the fifth transistor is coupled to a junction between said second and third resistors, the fourth and fifth resistors are coupled in series between an emitter of said fifth transistor and a third power source terminal, and wherein a junction between the fourth and fifth resistors is coupled to the base of said fourth transistor.

17. A semiconductor ECL integrated circuit device according to claim 13, further comprising:
- an output circuit coupled to receive the second minor amlitude ECL output signal from the ECL circuit comprising:
  - a third transistor having a base coupled to receive said second minor amplitude output signal from said ECL circuit;
  - a load element connected between a collector of said third transistor and said first power source terminal;
  - a fourth transistor having an emitter coupled to an emitter of the third transistor to operate as a current switch in conjunction with the third transistor;
  - a load element connected between a collector of said fourth transistor and said first power source terminal; and
  - an output terminal coupled to a collector of said fourth transistor,
  - wherein parameters of said load elements are set so that an output signal is produced at the output terminal of said output circuit having high and low voltage levels corresponding to the high and low voltage levels of an input signal applied to the input terminal of the ECL integrated circuit.

18. A semiconductor ECL integrated circuit device according to claim 12, wherein said negative feedback bias circuit comprises:
- a negative feedback transistor having a base coupled to a collector of the second transistor; and
- an emitter resistor and a constant-current source coupled in series with an emitter of the negative feedback transistor,
- wherein a base of the second transistor is coupled to a junction between the resistor and the constant-current source, and wherein the output terminal for the input circuit is coupled between a junction of the emitter and emitter resistor.

* * * * *